(12) United States Patent
Ogata et al.

(10) Patent No.: US 12,305,042 B2
(45) Date of Patent: May 20, 2025

(54) FILLER FOR ELECTRONIC MATERIALS AND METHOD FOR PRODUCING SAME, SLURRY FOR ELECTRONIC MATERIALS, AND RESIN COMPOSITION FOR ELECTRONIC MATERIALS

(71) Applicant: ADMATECHS CO., LTD., Miyoshi (JP)

(72) Inventors: Kohei Ogata, Miyoshi (JP); Yusuke Watanabe, Miyoshi (JP); Nobutaka Tomita, Miyoshi (JP)

(73) Assignee: ADMATECHS CO., LTD., Miyoshi (JP)

( * ) Notice: Subject to any disclaimer, the term of this patent is extended or adjusted under 35 U.S.C. 154(b) by 0 days.

(21) Appl. No.: 18/743,283

(22) Filed: Jun. 14, 2024

(65) Prior Publication Data

US 2024/0327644 A1 Oct. 3, 2024

Related U.S. Application Data

(63) Continuation of application No. PCT/JP2021/046624, filed on Dec. 16, 2021.

(51) Int. Cl.
| | | |
|---|---|---|
| C09C 1/30 | (2006.01) | |
| C08K 9/06 | (2006.01) | |
| C09C 3/04 | (2006.01) | |
| C09C 3/12 | (2006.01) | |

(52) U.S. Cl.
CPC ............ C09C 1/3081 (2013.01); C08K 9/06 (2013.01); C09C 3/043 (2013.01); C09C 3/12 (2013.01); C01P 2004/61 (2013.01); C01P 2004/62 (2013.01); C01P 2006/12 (2013.01); C01P 2006/82 (2013.01)

(58) Field of Classification Search
CPC .... C09C 1/30; C09C 3/04; C09C 3/12; C08K 9/06
USPC ........................................................ 524/209
See application file for complete search history.

(56) References Cited

U.S. PATENT DOCUMENTS

| | | |
|---|---|---|
| 6,365,649 B1 | 4/2002 | Kinose et al. |
| 7,083,770 B2 | 8/2006 | Shibasaki |
| 2003/0152506 A1 | 8/2003 | Shibasaki |
| 2012/0308824 A1 | 12/2012 | Matsukubo |
| 2020/0189922 A1 | 6/2020 | Watanabe et al. |
| 2020/0190332 A1 | 6/2020 | Watanabe et al. |
| 2024/0174520 A1 | 5/2024 | Minamikawa |

FOREIGN PATENT DOCUMENTS

| | | | |
|---|---|---|---|
| CN | 110938238 A | 3/2020 | |
| JP | S58-138740 A | 8/1983 | |
| JP | S60-199020 A | 10/1985 | |
| JP | 2000007319 A | 1/2000 | |
| JP | 2000191316 A | 7/2000 | |
| JP | 2002003213 A | 1/2002 | |
| JP | 2005146141 A | 6/2005 | |
| JP | 2011173779 A | 9/2011 | |
| JP | 2013212956 A | 10/2013 | |
| JP | 2020097498 A | 6/2020 | |
| JP | 7598489 B2 | 12/2024 | |
| WO | WO-2019238777 A1 * | 12/2019 | ............. A61K 8/025 |
| WO | WO-2020031267 A1 | 2/2020 | |
| WO | WO-2020065872 A1 | 4/2020 | |
| WO | WO-2022210260 A1 | 10/2022 | |

OTHER PUBLICATIONS

International Preliminary Report on Patentability issued Mar. 14, 2024 in PCT/JP2021/046624 (with partial English translation), 21 pages.
International Search Report issued Mar. 1, 2022 in PCT/JP2021/046624 (with English translation), 7 pages.
Masatoshi Chikazawa et. al., "Surface Chemistry of Powder Particles and Adhesion Phenomenon", Bulletin of the Society of Sea Water Science, Japan, Published in 1987, vol. 41, Issue 4, pp. 168-180 (with English translation).
Written Opinion issued Mar. 1, 2022 in PCT/JP2021/046624 (with English translation), 17 pages.
Decision to Grant issued Nov. 26, 2024 in Japanese Patent Application No. 2023-567458 (with English translation), 6 pages.
Combined Chinese Office Action and Search Report issued Jan. 25, 2025, in corresponding Chinese Patent Application No. 202180104966.8 (with machine English translation), 17 pages.

* cited by examiner

*Primary Examiner* — Deve V Hall
(74) *Attorney, Agent, or Firm* — Element IP, PLC

(57) ABSTRACT

A filler for electronic material according to the present invention has a silica particle material produced by a dry method, wherein D50 is 0.2 μm or greater and 7.0 μm or less. Further, in the filler for electronic material according to the present invention, (BET specific surface area)/(theoretical specific surface area calculated from D50) is 0.85 or greater and 1.2 or less (requirement 1), and/or D10/D50 is 0.55 or greater and 0.75 or less (requirement 2). When at least one of the requirements 1 and 2 is satisfied, electric characteristics such as a Df value are improved. Here, the BET specific surface area is a value measured by using nitrogen, and D50 is a 50 mass % cumulative diameter, i.e., a median diameter, and means a particle diameter at 50 mass % when the masses of particles are sequentially integrated from smaller particle diameters. Similarly, D10 is a 10 mass % cumulative diameter.

10 Claims, No Drawings

FILLER FOR ELECTRONIC MATERIALS AND METHOD FOR PRODUCING SAME, SLURRY FOR ELECTRONIC MATERIALS, AND RESIN COMPOSITION FOR ELECTRONIC MATERIALS

TECHNICAL FIELD

The present invention relates to a filler for electronic material, a method for producing the same, a slurry for electronic material, and a resin composition for electronic material.

BACKGROUND ART

A filler, for electronic material, made of a metal oxide particle material has been used as sealing materials for semiconductor devices, substrate materials, and other electronic materials, and a resin composition obtained by dispersing the filler for electronic material in a resin material has been especially known (e.g., Patent Literatures 1, 2).

Meanwhile, Patent Literature 2 indicates that, when a resin composition obtained by dispersing a metal oxide particle material in a resin material is applied to an electronic material, a preferable result of a pressure cooker test is obtained by setting the amount of physically adsorbed water in the metal oxide particle material to be dispersed to 50 ppm or less. If silica is heated to a temperature higher than 200° C., surface OH groups (bound water) begin to be removed (see Non-Patent Literature 1, for example). Thus, the physically adsorbed water of silica is measured by heating to 200° C.

Here, in the invention disclosed in Patent Literature 2, use of particles having a relatively large particle diameter is assumed, as defined in claim 1 that the particle diameter is 20 to 100 μm. In recent years, fillers for electronic materials have become smaller in particle diameter from submicron to nanometer order with the miniaturization of semiconductor device structures and circuits. The amount of physically adsorbed water increases in proportion to the surface area of a particle material. Thus, the smaller the particle diameter is, the larger the surface area and the amount of physically adsorbed water are. For example, in the case of a particle material whose particle diameter is decreased from submicron to nanometer order, the amount of water which is equivalent to an "amount of water of 50 ppm or less" as defined in Patent Literature 2 is increased by several tens of times and exceeds 1000 ppm. Even if heating is performed for the purpose of reducing the amount of water in order to reach the targeted amount of water, the amount of contained water (bound water, etc.) cannot be expected to be reduced to such an extent that improvement of electric characteristics is achieved, and sufficient electric characteristics are not achieved. In particular, even if the amount of physically adsorbed water is reduced, moisture in the air is sometimes quickly recombined thereafter.

Patent Literature 3 discloses a filler, for electronic material, made of a silica particle material in which the contained amount of water is reduced by combining a specific surface treatment and other configurations.

CITATION LIST

Patent Literature

Patent Literature 1: JPS58138740 (A)
Patent Literature 2: JPS60199020 (A) (claims 1, 2, etc.)
Patent Literature 3: JP2020097498 (A)

Non-Patent Literature

[Non-Patent Literature 1] Surface Chemistry of Powder Particles and Adhesion Phenomenon, Masatoshi CHIKAZAWA and Takashi TAKEI, Bulletin of the Society of Sea Water Science, Japan, 1987, Vol. 41, No. 4, p. 168-180

SUMMARY OF INVENTION

Technical Problem

Meanwhile, in recent years, there have been increasing demands for electronic materials, and materials having higher performances than before have been desired. With respect to the filler for electronic material provided in Patent Literature 3 as well, there are demands for those having higher performances.

In consideration of the above circumstances, an object addressed by the present inventors is to provide a filler, for electronic material, excellent in electric characteristics, a method for producing the same, a slurry for electronic material, and a resin composition for electronic material.

Solution to Problem (1) A filler for electronic material according to the present invention for solving the above problem has a silica particle material produced by a dry method, wherein D50 is 0.2 μm or greater and 7.0 μm or less. Further, in the filler for electronic material according to the present invention, (BET specific surface area)/(theoretical specific surface area calculated from D50) is 0.85 or greater and 1.2 or less (requirement 1), and/or D10/D50 is 0.55 or greater and 0.75 or less (requirement 2).

When at least one of the requirements 1 and 2 described above is satisfied, electric characteristics such as a Df value are improved. Here, the BET specific surface area is a value measured by using nitrogen, and D50 is a 50 mass % cumulative diameter, i.e., a median diameter, and means a particle diameter at 50 mass % when the masses of particles are sequentially integrated from smaller particle diameters. Similarly, D10 is a 10 mass % cumulative diameter.

(2) A method for producing a filler for electronic material according to the present invention for solving the above problem is a method for producing the filler for electronic material according to (1) above, and includes: a silica particle raw material preparation step of producing a silica particle raw material by a dry method; and a classification step of separating a fraction having a large particle diameter from the silica particle raw material.

In the classification step, particles having small particle diameters are removed. Particles having small particle diameters have a relatively larger contained amount of water than particles having large particle diameters. Therefore, through adjustment of the particle size distribution, the contained amount of water is reduced, whereby electric characteristics are improved. In particles having small particle diameters, a relatively larger number of silanol groups are present than in particles having large particle diameters. Therefore, through adjustment of the particle size distribution, electric characteristics are improved.

Advantageous Effects of Invention

Since the filler for electronic material according to the present invention has the above configuration, the filler for electronic material is excellent in electric characteristics such as a Df value. In particular, the filler for electronic material is suitably produced by the method for producing the filler for electronic material according to the present invention.

DESCRIPTION OF EMBODIMENTS

Hereinafter, a filler for electronic material, a method for producing the same, a slurry for electronic material, and a resin composition for electronic material according to the present invention will be described in detail based on an embodiment.

(Filler for Electronic Material)

The filler for electronic material according to the present embodiment may be used as a material such as a sealing material for electronic components such as semiconductors, underfills, substrate materials, and heat transfer materials. In particular, desirably, the filler for electronic material is used in a usage related to a high frequency (e.g., 1 GHz or higher) electronic component. For example, the filler for electronic material is suitably used for forming a substrate of an electronic device that handles high frequencies. Preferably, the filler for electronic material is used as a filler used in a slurry for electronic material and a resin composition for electronic material described later.

In the filler for electronic material according to the present embodiment, D50 is 0.2 μm or greater and 7.0 μm or less. D50 is a value measured according to LA750 500 mode (HORIBA, Ltd.). As for D50, the lower limit value is preferably 0.3 μm, 0.5 μm, or 1.0 μm, and the upper limit value is preferably 5.0 μm, 3.5 μm, or 2.5 μm. These lower limit values and upper limit values may be used in any combination. The particle diameter may be measured by a laser scattering method. A silica particle material satisfies at least one of requirements 1 and 2 below, and preferably satisfies both of the requirements 1 and 2.

The requirement 1 is that (BET specific surface area)/(theoretical specific surface area calculated from D50) is 0.85 or greater and 1.2 or less. The measurement of the specific surface area is a value measured by the BET method using nitrogen. The theoretical specific surface area calculated from D50 is a surface area calculated from the value of D50 when the silica particle material is assumed to be spheres. Specifically, the theoretical specific surface area is calculated by a formula of specific surface area=6/(D50×true specific gravity).

In the description, (BET specific surface area)/(theoretical specific surface area calculated from D50) may be referred to as "specific surface area coefficient" as appropriate. As for the specific surface area coefficient, examples of the lower limit value include 0.90 and 0.95, and examples of the upper limit value include 1.18, 1.15, and 1.10. These lower limit values and upper limit values may be used in any combination. A specific surface area coefficient closer to 1 is preferable.

When the specific surface area coefficient is greater than 1, if particles having small particle diameters are removed, the specific surface area coefficient is made close to 1. When the specific surface area coefficient is smaller than 1, if coarse particles are removed, the specific surface area coefficient is made close to 1.

The BET specific surface area is not particularly limited, but preferably is 0.3 m$^2$/g or greater and 10 m$^2$/g or less. Examples of the lower limit value of the specific surface area include 0.7 m$^2$/g, and examples of the upper limit include 1.5 m$^2$/g, 4.5 m$^2$/g, and 8 m$^2$/g. These lower limit values and upper limit values may be used in any combination.

The requirement 2 is that D10/D50 is 0.55 or greater and 0.75 or less, the lower limit value is 0.60 or 0.65, and the upper limit value is 0.70. These lower limit values and upper limit value may be used in any combination. The maximum value of D10/D50 is 1. Making D10/D50 close to 1 is achieved if particles having small particle diameters are removed.

The filler for electronic material according to the present embodiment is a particle material having a silica particle material produced by a dry method. The particle material may be solid or hollow, or may be a mixture of a solid particle material and a hollow particle material. The particle material preferably has a spherical shape. For example, the lower limit value of the sphericity is preferably 0.9, 0.95, 0.98, or 0.99.

The contained amount of the silica particle material in the filler for electronic material is not particularly limited, and examples of the lower limit value of the contained amount include 50%, 60%, 70%, 80%, 90%, 95%, and 100%. Examples of the particle material that may be contained other than the silica particle material include materials for resins such as fluorine-containing resins, e.g., inorganic oxides such as alumina, zirconia, and titania, inorganic nitrides such as boron nitride and aluminum nitride, and barium titanate, calcium titanate, and strontium titanate. The particle material may be mixed as a particle material different from the silica particle material, or may be contained in the silica particle material. As for the inorganic oxides, composite oxides of the inorganic oxides, silica, or the like may be used.

The dry method is a method for forming a silica particle material without contact with water. Specific examples of the dry method include a VMC method in which a silica particle material is prepared by burning powder made of a metal silicon in an oxidizing atmosphere gas and rapidly cooling the powder, and a melting method in which a silica particle material is obtained by putting powder made of silica into a flame to melt the powder and then rapidly cooling the melted powder. Thereafter as well, preferably, the silica particle material is kept without contact with water. If the silica particle material has come into contact with water, the amount of water is preferably reduced by heating. A preferable amount of water will be described later.

The VMC method and the melting method are each considered as a dry production method (the dry method in the present description), since powder is put into a high-temperature atmosphere such as a flame to burn the powder, or since contact with water is avoided after the powder is heated and melted. In each of the VMC method and the melting method, the particle size distribution of the silica particle material to be prepared is controlled by adjusting the particle size distribution or amount of powder to be input. For example, if the particle diameter or amount of powder to be input is smaller, the particle diameter of a silica particle material to be prepared is also smaller.

In each of the VMC method and the melting method, the amount of water present in the high-temperature atmosphere into which powder serving as a raw material is to be put is preferably reduced. For example, the powder that is a raw material is dispersed in a certain dispersion medium and transported, and the water in the dispersion medium is desirably removed. In addition, the water contained in the oxidizing atmosphere gas in the VMC method or in the high-temperature atmosphere in the melting method is preferably removed. For removal of water, general dehumidification methods (condensation and removal of contained water by reducing the temperature, removal of water with a desiccant, etc.) may be employed. In addition, when the amount of water originally contained is low, the water may also be removed by performing operations such as using air that changes depending on the season, weather, etc.

In the filler for electronic material according to the present embodiment, the amount of water generated by heating per unit surface area based on the BET specific surface area is preferably in the range described below. First, the amount (hereinafter, referred to as "generated water amount 200° C.") of water generated when heating is performed from 25° C. to 200° C. is preferably 90 ppm/m$^2$ or less and further preferably 80 ppm/m$^2$, 60 ppm/m$^2$, or less. The amount (hereinafter, referred to as "generated water amount 550° C.) of water generated when heating is performed from 200° C. to 550° C. is preferably 100 ppm/m$^2$, 150 ppm/m$^2$, or less, and further preferably 120 ppm/m$^2$ or less.

The generated water amount 200° C. is a value obtained by dividing the parts per million of the amount of water generated in association with temperature increase from normal temperature (25° C.) to 200° C. by a unit surface area based on the BET specific surface area. The parts per million of the amount of water with respect to the generated water amount 200° C. is calculated by measuring the amount of water generated in association with temperature increase from normal temperature (25° C.) to 200° C. by the Karl Fischer method, and then using the mass of the filler for electronic material for which the measurement has been performed, as a reference.

The generated water amount 550° C. is a value obtained by dividing the parts per million of the amount of water generated in association with temperature increase from 200° C. to 550° C. by the unit surface area based on the BET specific surface area. The parts per million of the amount of water with respect to the generated water amount 550° C. is calculated by measuring the amount of water generated in association with temperature increase from 200° C. to 550° C. by the Karl Fischer method, and then using the mass of the filler for electronic material for which the measurement has been performed, as a reference.

The filler for electronic material according to the present embodiment is preferably subjected to surface treatment. The surface treatment is not particularly limited. However, the filler for electronic material is preferably subjected to surface treatment with a silane compound having one or more functional groups selected from the group consisting of a vinyl group, a phenyl group, a phenylamino group, an alkyl group having four or more carbon atoms, a methacryl group, and an epoxy group. The treatment amount of the silane compound will be described in a later-described method for producing the filler for electronic material, and thus is not described here.

(Method for Producing the Filler for Electronic Material)

A method for producing the filler for electronic material according to the present embodiment is a method that enables suitable production of the filler for electronic material according to the present embodiment described above, and has a silica particle raw material preparation step, a classification step, and other steps employed as necessary.

The silica particle raw material preparation step is a step of producing a silica particle raw material by a dry method. As the dry method, for example, a so-called VMC method in which silica is formed by putting a particle raw material containing a metal silicon into a high-temperature oxidizing atmosphere to oxidize and explosively burn the metal silicon, and then rapidly cooling the resultant matter, or a so-called melting method in which silica is formed by putting a particle raw material made of silica into a high-temperature atmosphere having a temperature of the melting point or higher of silica, to melt the particle raw material, and then rapidly cooling the resultant matter, may be employed. The particle raw material composed of the metal silicon as the raw material for the VMC method or composed of silica as the raw material for the melting method may contain a material other than the metal silicon and silica. The obtained silica particle raw material is preferably kept without contact with water. Being kept without contact with water means not being in contact with liquid water, and further, not being exposed to an atmosphere in such a condition where dew condensation may occur.

The classification step is a step of separating a fraction having a large particle diameter from the silica particle raw material. As for the classification step, a method in which a fraction having a large particle diameter is taken out of the silica particle raw material, or a method in which a fraction having a large particle diameter is left by removing a fraction having a small particle diameter may be employed as a classification operation. The classification operation may be performed in either a liquid atmosphere or a gas atmosphere. The classification operation is repeated until a necessary particle size distribution is obtained. If acceleration such as centrifugal force is applied, the speed and accuracy of the classification are improved.

The classification step is preferably performed in an atmosphere not containing water. When the classification step is performed in an atmosphere containing water, a water removal step of removing water by a heating step is preferably performed. Examples of the lower limit value of the heating temperature in the water removal step include 200° C. and 550° C., and the upper limit value is set to a temperature at which the silica particle raw material is not sintered. Whether or not the silica particle raw material is sintered differs depending on the heating time. When the silica particle raw material is separated to primary particles by crushing, the silica particle raw material is determined to not having been sintered.

The "atmosphere not containing water" means that, when the classification step is performed in a liquid, the contained amount of water in the liquid is 1000 ppm or less (preferably 500 ppm or less).

Specific examples of the method that may be employed as the classification step include general classification methods such as a method (air flow classification method) in which classification is performed by using a flow such as a swirling flow, a method in which classification is performed with a sieve while using the silica particle raw material as is, and a method in which classification is performed based on the difference in precipitation speed, and in addition, a method in which the silica particle raw material is immersed in an alkaline solution to be dissolved, thereby causing particles having small particle diameters to be dissolved and disappear, thereby selectively removing a fraction having a small particle diameter.

In particular, the air flow classification method is desirably employed. The air flow classification method is a classification method in which contact with water is less likely to occur, and contact with a sieve during classification, causing entry of impurities, is less likely to occur.

A step of separating a fraction having a large particle diameter by dispersing the silica particle raw material in a dispersion medium and then using the difference in precipitation speed due to the magnitudes of the particle diameters, may also be employed. Specifically, a precipitation layer as a fraction having a large particle diameter is preferably collected. The dispersion medium to be used is not particularly limited, and water or an organic solvent may be used singly, or water and an organic solvent may be used in a form of a mixture. As for the organic solvent, an organic solvent in which the contained amount of water is small is desirably used. Examples of the upper limit value of the contained amount of water in the organic solvent include 1000 ppm and 500 ppm. The reason for selecting the organic solvent is to prevent moisture due to water from being absorbed in the silica particle raw material.

As for the organic solvent, an organic solvent that is easily removed from the silica particle material by drying is preferable. Examples of the organic solvent include alcohols such as methanol, ethanol, 1-propanol, 2-propanol, and butanol, and ketones such as acetone, methyl isobutyl ketone, methyl ethyl ketone, and diethyl ketone.

The concentration at which the silica particle raw material is dispersed in the dispersion medium is not particularly limited, but examples of the concentration include 10%, 20%, 30%, 40%, 50%, 60%, and 70% with respect to the total mass.

When the classification is performed by using a liquid, a step (liquid removal step) of removing the used liquid is included. In the case of the air flow classification method as well, a drying step similar to the liquid removal step may be included. When an organic solvent is used as the liquid, an organic solvent removal step as the liquid removal step is included. The removal step is a step of removing a liquid from the classified fraction having a large particle diameter. A specific liquid removal method is not particularly limited, but a drying step of removing the liquid by evaporation is preferably employed.

The drying step may be performed by heating, sending a dry gas, or performing pressure reduction, or through combination of these operations. Particles may aggregate due to the drying step, and thus, a step of performing crushing may be provided after the drying step. When the drying step is employed as the water removal step described above, the drying step may be performed simultaneously with the water removal step.

As another step, a surface treatment step may be included. The surface treatment is not particularly limited. However, the surface treatment is preferably performed with a silane compound having one or more functional groups selected from the group consisting of a vinyl group, a phenyl group, a phenylamino group, an alkyl group having four or more carbon atoms, a methacryl group, and an epoxy group. The surface treatment may be performed on the silica particle material in a dried state after the drying step, or may be performed on the silica particle material in a state of being dispersed in the organic solvent in the classification step.

The surface treatment may be divided into two or more parts to be performed. For example, after the surface treatment described above is performed, if surface treatment is performed with an organosilazane, OH groups present on the surface are reduced. OH groups present on the surface are also relevant to bound water. Thus, if the organosilazane is caused to react with the OH groups on the surface, the amount of bound water is reduced. Here, the organosilazane to be caused to react is not particularly limited, but an example thereof is hexamethyldisilazane. The amount of the organosilazane with which the surface treatment is performed is preferably an amount, or an excess amount, that allows all OH groups present on the surface to be reacted.

The surface treatment with the silane compound is performed by causing the silane compound to be in direct contact with the silica particle material, or causing a surface treatment agent (e.g., a solution obtained by dissolving the silane compound in a solvent) containing the silane compound, to be in contact with the surface of the silica particle material.

As the treatment amount of the silane compound, when the amount that allows reaction of all OH groups present on the surface of the filler for electronic material before the surface treatment is defined as 100%, 200%, 150%, 120%, 100%, 80%, 50% or the like may be employed. These lower limit values and upper limit values may be used in any combination.

(Slurry for Electronic Material)

The slurry for electronic material according to the present embodiment is a composition obtained by dispersing the above-described filler for electronic material according to the present embodiment in a dispersion medium. The slurry for electronic material according to the present embodiment may be used for a semiconductor substrate material, or the like, and in particular, is preferably used for a high frequency substrate material. The dispersion medium does not substantially contain water, and, in particular, the contained amount of water is preferably 1000 ppm or less and more preferably 500 ppm or less.

The mixing ratio between the filler for electronic material and the dispersion medium in the slurry for electronic material is not particularly limited, but the contained amount of the filler for electronic material is preferably as large as possible. When the mixed amount of the filler for electronic material is large, the viscosity tends to be high. Therefore, the filler for electronic material may be mixed until a viscosity as high as possible that is allowable in consideration of handleability is attained. For example, (the filler for electronic material):(the dispersion medium) may be about 20:80 to 80:20 in a mass ratio.

The dispersion medium is not particularly limited, and examples thereof include organic solvents such as silicone oil, methyl ethyl ketone, alcohol, and hexane, and resin precursors such as epoxy resin precursors, polyester precursors, and silicone resin precursors.

The filler for electronic material is preferably subjected to surface treatment. In the surface treatment, a functional group that improves the affinity of the filler for electronic material with the dispersion medium to be used or with a mating member that comes into contact with the filler for electronic material when the filler for electronic material is finally used is preferably introduced.

(Resin Composition for Electronic Material)

The resin composition for electronic material according to the present embodiment is a cured product including the above-described filler for electronic material and a resin material in which the filler for electronic material is dispersed. The resin material has a contained amount of water of preferably 1000 ppm or less and more preferably 500 ppm or less.

The electronic material is preferably applied to an electronic material to be used for a high frequency usage such as a high frequency substrate. The filler for electronic material according to the present embodiment has a low Df value, and thus, even when the filler for electronic material is used in a usage where a high frequency flows, generation of loss is small.

The mixing ratio between the filler for electronic material and the resin material in the resin composition for electronic material is not particularly limited, but the contained amount of the filler for electronic material is preferably as large as possible. For example, the filler for electronic material and the resin material may be mixed such that the filler for electronic material: the resin material is about 10:90 to 90:10 in a mass ratio.

The resin material is not particularly limited, and examples thereof include general resin materials such as thermosetting resins (at the time of mixing, the thermosetting resin may be in either of a state before curing and a state after curing) and thermoplastic resins, for example, epoxy resins, melamine resins, acrylic resins, polycarbonate resins, polyesters, silicone resins, liquid crystal polymers (LCPs), polyimides, cyclic olefin polymers (COPs), and polyphenylene oxides (PPOs). A single resin material may be used, or a plurality of types of resin materials may be mixed (alloyed or the like) and used. The resin material has a contained amount of water of preferably 1000 ppm or less and more preferably 500 ppm or less.

The filler for electronic material is preferably subjected to surface treatment. In the surface treatment, a functional group that improves the affinity with the resin material to be used is preferably introduced.

Further, as another step, a heating step may be included. The heating step is a step of removing, by heating, water contained in the filler for electronic material. Even when the silica particle raw material is produced by the dry method, water present in the atmosphere may adhere to the surface of the silica particle raw material. Thus, the contained amount of water is reduced by heating.

For example, if heating is performed at about 550° C., further, at 550° C. or higher, the values of the generated water amount 550° C. and the generated water amount 200° C. are effectively reduced. The heating step is performed at a temperature at which the silica particle material is not melted or sintered. The heating step may be performed at any time during the production step, but in particular, the heating is preferably performed simultaneously with preparation of the silica particle material in the silica particle raw material preparation step.

A specific heating method is a method of heating using an electric furnace or a gas furnace. Specific examples of the apparatus include a rotary kiln, a fluidized bed furnace, and a firing furnace. The atmosphere during the heating is not particularly limited, and for example, as the heating atmosphere, nitrogen, argon, or dry air may be used.

EXAMPLES

The filler for electronic material according to the present invention and the method for producing the same will be described in detail below, based on Examples.
(Preparation of Sample)

Test Examples 1, 10 (D10: 1.7 µm, D50: 2.5 µm)

Silica produced by the VMC method was used as the silica particle raw material (the silica particle raw material preparation step). The silica particle raw material had a D50 of 1.9 µm and a D10 of 1.0 µm. With respect to this silica particle raw material, a fraction having a large particle diameter was classified by air flow classification (the classification step). Vinyltrimethoxysilane as the silane compound was caused to react with the silica particle material contained in the obtained fraction having a large particle diameter (first surface treatment step). Hexamethyldisilazane was caused to react, and the resultant matter was used as a test sample of the present Test Example (second surface treatment step). The specific surface area of this silica particle material was 1.1 m$^2$/g. A filler for electronic material not subjected to the surface treatment step was used as a test sample of Test Example 10.

Test Examples 2 and 3 (D10: 1.7 µm, D50: 2.5 µm)

Using the same method as in Test Example 1 except that phenyltrimethoxysilane was used instead of vinyltrimethoxysilane, a filler for electronic material was produced and used as a test sample of Test Example 2. Using the same method as in Test Example 1 except that N-phenyl-3-aminopropyltrimethoxysilane was used instead of vinyltrimethoxysilane, a filler for electronic material was produced and used as a test sample of Test Example 3.

Test Examples 4, 5, and 12 (D10: 0.4 µm, D50: 0.7 µm)

Using the same methods as those in Test Examples 1 and 2 except that silica particle raw materials produced by the VMC method and each having a D50 of 0.5 µm and a D10 of 0.3 µm were used, fillers for electronic material were produced and used as test samples of Test Example 4 (vinyltrimethoxysilane) and Test Example 5 (phenyltrimethoxysilane), respectively. The amount of the treatment agent used in the surface treatment was set to be the same amount per unit surface area. A filler for electronic material not subjected to the surface treatment step was used as a test sample of Test Example 12.

Test Examples 6, 7, and 11 (D10: 1.4 µm, D50: 2.3 µm)

Using the same methods as those in Test Examples 1 and 2 except that silica particle raw materials produced by the VMC method and each having a D50 of 2.0 µm and a D10 of 1.1 µm were used, fillers for electronic material were produced and used as test Test Example 6 samples of (vinyltrimethoxysilane) and Test Example 7 (phenyltrimethoxysilane), respectively. The amount of the treatment agent used in the surface treatment was set to be the same amount per unit surface area. A filler for electronic material not subjected to the surface treatment step was used as a test sample of Test Example 11.

Test Examples 8, 13 (D10: 2.7 µm, D50: 4.8 µm)

Using the same method as in Test Example 1 except that a silica particle raw material produced by the melting method and having a D50 of 4.4 µm and a D10 of 1.5 µm was used, a filler for electronic material was produced and used as a test sample of Test Example 8. The amount of the treatment agent used in the surface treatment was set to be the same amount per unit surface area. A filler for electronic material not subjected to the surface treatment step was used as a test sample of Test Example 13.

Test Example 9 and 14 (D10: 3.8 µm, D50: 7.0 µm)

Using the same method as in Test Example 1 except that a silica particle raw material produced by the melting method and having a D50 of 6.8 µm and a D10 of 2.4 µm was used, a filler for electronic material was produced and used as a test sample of Test Example 9. The amount of the treatment agent used in the surface treatment was set to be the same amount per unit surface area. A filler for electronic material not subjected to the surface treatment step was used as a test sample of Test Example 14.

Test Example 15 (D10: 1.3 μm, D50: 2.2 μm)

Using the same method as in Test Example 1 except that a silica particle raw material produced by the VMC method and having a D50 of 1.9 μm and a D10 of 1.0 μm was used, classification was performed by using water, and the surface treatment was not performed, a filler for electronic material was produced and used as a test sample of Test Example 15. Since the silica particle raw material was dispersed in water and classified, the amount of water was increased.

Test Examples 16-20

Silica particle raw materials produced by the VMC method and having D50s and D10s shown in Table 3 were used, as they were, as test samples of the respective Test Examples. The D50s and the D10s were obtained by changing the input amount of the metal silicon (atmosphere concentration) and the particle diameter of the metal silicon. As for Test Example 20, surface treatment was performed with 3-methacryloxypropylmethyldimethoxysilane.

Test Example 21 (a Silica Particle Raw Material was Produced by a Wet Method)

Tetraethyl orthosilicate was hydrolyzed in the presence of an alkaline catalyst, to synthesize a silica particle raw material, and the silica particle raw material was used as a test sample of the present Test Example. The obtained silica particle raw material had a D10 of 0.2 μm and a D50 of 0.4 μm.

Test Example 22 (the Surface Treatment Step in the Presence of Water)

The surface treatment step was performed by adding a vinyltrimethoxysilane aqueous solution to the test sample of Test Example 12 to cause reaction therewith, and the resultant matter was used as a test sample of the present Test Example.

Test Examples 23 and 24 (D10: 1.7 μm, D50: 2.6 μm)

Silica produced by the VMC method was used as the silica particle raw material (the silica particle raw material preparation step). The silica particle raw material had a D50 of 1.9 μm and a D10 of 1.0 μm. This silica particle raw material was dispersed in an organic solvent to obtain a raw material slurry. The raw material slurry was left to stand for a certain time, whereby a fraction having a large particle diameter was precipitated (the classification step). The obtained fraction having a large particle diameter was subjected to the drying step to remove the organic solvent, whereby a silica particle material was obtained (the organic solvent removal step). Vinyltrimethoxysilane as the silane compound was caused to react with this silica particle material (the first surface treatment step). Hexamethyldisilazane was caused to react, and the resultant matter was used as a test sample of Test Example 23 (the second surface treatment step). The specific surface area of this silica particle material was 1.1 m$^2$/g. A filler for electronic material not subjected to the surface treatment step was used as a test sample of Test Example 24.

(Test)

With respect to the test sample of each Test Example, D10 and D50 were measured by LA-750 manufactured by HORIBA, Ltd., the specific surface area was measured by the BET method using nitrogen gas, the generated water amount 200° C. and the generated water amount 550° C. were measured by the Karl Fischer method and were converted to those per unit surface area, and the results are shown in the tables.

The value of D10/D50 was calculated from the measured D10 and D50, SSA/ssa was calculated from the measured specific surface area (actually measured value: SSA) and the specific surface area (calculated value: ssa) calculated from D50, and the results are shown in the tables.

Further, with respect to the sample of each Test Example, the dielectric loss tangent (Df) at 1 GHz was measured. The measurement of the dielectric loss tangent was performed according to JIS C 2138. Specifically, a relative permittivity and a dielectric loss tangent were measured at 1 GHZ using a network analyzer (E5071C, manufactured by Keysight Technologies, Inc.) and a cavity resonator perturbation method. The measurement was performed according to ASTMD2520 (JIS C2565).

TABLE 1

|  |  | Test Example 1 | Test Example 2 | Test Example 3 | Test Example 4 |
|---|---|---|---|---|---|
| Silica particle material production step | | dry method | dry method | dry method | dry method |
| Particle diameter/μm | D10 | 1.7 | 1.7 | 1.7 | 0.4 |
| | D50 | 2.5 | 2.5 | 2.5 | 0.7 |
| Specific surface area/m$^2$/g | actually measured value SSA | 1.1 | 1.1 | 1.1 | 4.1 |
| | calculated value ssa | 1.1 | 1.1 | 1.1 | 4.2 |
| Amount of water/ppm | 200° C. | 38 | 78 | 92 | 172 |
| | 550° C. | 106 | 115 | 138 | 142 |
| First surface treatment | | vinyl | phenyl | phenylamino | vinyl |
| Second surface treatment | | with | with | with | with |

TABLE 1-continued

|  |  |  |  |  |
|---|---|---|---|---|
| D10/D50 | 0.69 | 0.69 | 0.69 | 0.57 |
| Specific surface area coefficient (SSA/ssa) | 1.05 | 1.05 | 1.05 | 0.98 |
| 200° C. water amount/specific surface area | 34 | 69 | 82 | 42 |
| 550° C. water amount/specific surface area | 94 | 101 | 122 | 35 |
| Df | 0.0001 | 0.0001 | 0.0002 | 0.0003 |

|  | Test Example 5 | Test Example 6 | Test Example 7 | Test Example 8 | Test Example 9 |
|---|---|---|---|---|---|
|  | dry method | dry method | dry method | dry method | dry method |
|  | 0.4 | 1.4 | 1.4 | 2.7 | 3.8 |
|  | 0.7 | 2.3 | 2.3 | 4.8 | 7.0 |
|  | 4.1 | 1.4 | 1.4 | 0.7 | 0.4 |
|  | 4.2 | 1.2 | 1.2 | 0.6 | 0.4 |
|  | 184 | 105 | 100 | 28 | 15 |
|  | 124 | 152 | 119 | 68 | 55 |
|  | phenyl | vinyl | phenyl | vinyl | vinyl |
|  | with | with | with | with | with |
|  | 0.57 | 0.62 | 0.62 | 0.56 | 0.55 |
|  | 0.98 | 1.16 | 1.16 | 1.20 | 1.03 |
|  | 45 | 76 | 72 | 42 | 38 |
|  | 31 | 109 | 86 | 101 | 138 |
|  | 0.0003 | 0.0002 | 0.0002 | 0.0001 | 0.0001 |

TABLE 2

|  |  | Test Example 10 | Test Example 11 | Test Example 12 | Test Example 13 | Test Example 14 |
|---|---|---|---|---|---|---|
| Silica particle material production step |  | dry method | dry method | dry method | dry method | dry method |
| Particle diameter/μm | D10 | 1.7 | 1.4 | 0.4 | 2.7 | 3.8 |
|  | D50 | 2.5 | 2.3 | 0.7 | 4.8 | 7.0 |
| Specific surface area/m$^2$/g | actually measured value SSA | 1.1 | 1.4 | 4.1 | 0.7 | 0.4 |
|  | calculated value ssa | 1.1 | 1.2 | 4.2 | 0.56 | 0.4 |
| Amount of water/ppm | 200° C. | 56 | 96 | 211 | 44 | 38 |
|  | 550° C. | 93 | 103 | 126 | 88 | 62 |
| First surface treatment |  | without | without | without | without | without |
| Second surface treatment |  | without | without | without | without | without |
| D10/D50 |  | 0.69 | 0.62 | 0.57 | 0.56 | 0.55 |
| Specific surface area coefficient (SSA/ssa) |  | 1.05 | 1.16 | 0.98 | 1.20 | 1.03 |
| 200° C. water amount/specific surface area |  | 49 | 69 | 52 | 66 | 95 |
| 550° C. water amount/specific surface area |  | 83 | 74 | 31 | 131 | 155 |
| Df |  | 0.0008 | 0.0010 | 0.0011 | 0.0006 | 0.0004 |

TABLE 3

| | | Test Example 15 | Test Example 16 | Test Example 17 | Test Example 18 | Test Example 19 | Test Example 20 |
|---|---|---|---|---|---|---|---|
| Silica particle material production step | | dry method | dry method | dry method | dry method | dry method | dry method |
| Particle diameter/μm | D10 | 1.3 | 1.0 | 0.7 | 0.5 | 0.3 | 0.3 |
| | D50 | 2.2 | 1.9 | 1.4 | 1.2 | 0.5 | 0.5 |
| Specific surface area/m$^2$/g | actually measured value SSA | 1.4 | 1.7 | 3.5 | 4.5 | 6.1 | 6.5 |
| | calculated value ssa | 1.2 | 1.4 | 1.9 | 2.3 | 5.1 | 5.2 |
| Amount of water/ppm | 200° C. | 334 | 220 | 283 | 367 | 302 | 156 |
| | 550° C. | 272 | 253 | 312 | 555 | 353 | 326 |
| First surface treatment | | without | without | without | without | without | methacryl |
| Second surface treatment | | without | without | without | without | without | with |
| D10/D50 | | 0.59 | 0.53 | 0.50 | 0.42 | 0.47 | 0.51 |
| Specific surface area coefficient (SSA/ssa) | | 1.10 | 1.21 | 1.87 | 1.93 | 1.22 | 1.25 |
| 200° C. water amount/specific surface area | | 246 | 128 | 80 | 82 | 50 | 24 |
| 550° C. water amount/specific surface area | | 221 | 147 | 89 | 125 | 58 | 50 |
| Df | | 0.0023 | 0.0017 | 0.0019 | 0.0020 | 0.0014 | 0.0016 |

TABLE 4

| | | Test Example 21 | Test Example 22 | Test Example 23 | Test Example 24 |
|---|---|---|---|---|---|
| Silica particle material production step | | wet method | dry method | dry method | dry method |
| Particle diameter/μm | D10 | 0.2 | 0.4 | 1.7 | 1.7 |
| | D50 | 0.4 | 0.7 | 2.6 | 2.6 |
| Specific surface area/m$^2$/g | actually measured value SSA | 10 | 6.35 | 1.1 | 1.1 |
| | calculated value ssa | 7.76 | 3.74 | 1.1 | 1.1 |
| Amount of water/ppm | 200° C. | 3908 | 508 | 36 | 72 |
| | 550° C. | 2937 | 653 | 99 | 108 |
| First surface treatment | | without | wet vinyl | vinyl | without |
| Second surface treatment | | without | without | with | without |
| D10/D50 | | 0.48 | 0.48 | 0.67 | 0.67 |
| Specific surface area coefficient (SSA/ssa) | | 1.3 | 1.7 | 1.05 | 1.05 |
| 200° C. water amount/specific surface area | | 391 | 80 | 32 | 64 |
| 550° C. water amount/specific surface area | | 294 | 103 | 88 | 96 |
| Df | | 0.2492 | 0.0053 | 0.0001 | 0.0008 |

The tables clearly revealed that, with respect to Test Examples 1 to 14, the requirement 1: Specific surface area coefficient (SSA/ssa) and the requirement 2: D10/D50 are satisfied, and the Df is smaller than that in Test Examples 16 to 22 not satisfying the requirement 1 and the requirement 2. With respect to Test Example 15, although the requirements 1 and 2 are satisfied, the generated water amount 200° C. and the generated water amount 550° C. are large. Therefore, Test Examples 1 to 14 are considered to be excellent since Test Examples 1 to 14 have smaller Df values than that in Test Example 15.

Out of Test Examples 1 to 14, Test Examples 1 to 8 in which the surface treatment was performed with the silane compound are found to have smaller Dfs than those of Test Example 10 (corresponding to Test Examples 1 to 3), Test Example 11 (corresponding to Test Examples 6 and 7), Test Example 12 (corresponding to Test Examples 4 and 5), and Test Example 13 (corresponding to Test Example 8) which correspondingly have the same values of D10 and D50. Therefore, the Df was found to become small when the surface treatment is performed.

In addition, when the filler for electronic material having a vinyl group as the silane compound and the filler for electronic material having a phenyl group as the silane compound are compared with each other, both are found to be excellent since the Df values are the same. Test Examples 1 and 2 treated with silane compounds having a vinyl group and a phenyl group, respectively, each have a smaller Df than that of Test Example 3 treated with a silane compound having a phenylamino group. Thus, as the silane compound, a silane compound having a vinyl group or a phenyl group was found to be excellent as compared with a silane compound having a phenylamino group.

With respect to Test Examples 23 and 24, classification using the difference in precipitation speed in the liquid was performed. Similar to Test Examples employing the air flow classification method, Test Examples 23 and 24 satisfied the requirements 1 and 2, and small Dfs were found to be obtained.

The invention claimed is:

1. A filler, for electronic material, having a silica particle material produced by a dry method, wherein
    D50 is 0.2 μm or greater and 7.0 μm or less,
    (BET specific surface area)/(theoretical specific surface area calculated from D50) is 0.85 or greater and 1.2 or less and D10/D50 is 0.55 or greater and 0.75 or less,
    an amount of water generated when heating is performed from 25° C. to 200° C. per unit surface area (1 m$^2$) based on the BET specific surface area is 90 ppm or less, and
    an amount of water generated when heating is performed from 200° C. to 550° C. per unit surface area (1 m$^2$) based on the BET specific surface area is 150 ppm or less.

2. A filler, for electronic material, having a silica particle material produced by a dry method, wherein
D50 is 0.2 μm or greater and 2.5 μm or less,
D10/D50 is 0.62 or greater and 0.75 or less, and
BET specific surface area is 4.5 m$^2$/g or less.

3. The filler for electronic material according to claim 2, wherein
an amount of water generated when heating is performed from 25° C. to 200° C. per unit surface area (1 m$^2$) based on the BET specific surface area is 90 ppm or less, and
an amount of water generated when heating is performed from 200° C. to 550° C. per unit surface area (1 m$^2$) based on the BET specific surface area is 150 ppm or less.

4. The filler for electronic material according to claim 2, being subjected to surface treatment with a silane compound having one or more functional groups selected from the group consisting of a vinyl group, and a phenyl group.

5. A slurry for electronic material, comprising:
the filler for electronic material according to claim 2; and
a dispersion medium in which the filler for electronic material is dispersed.

6. A resin composition for electronic material, comprising:
the filler for electronic material according to claim 2; and
a resin material in which the filler for electronic material is dispersed.

7. A method for producing the filler for electronic material according to claim 2, the method comprising:
a silica particle raw material preparation step of producing a silica particle raw material by a dry method; and
a classification step of separating a fraction having a large particle diameter from the silica particle raw material, wherein
the classification step includes
a step of performing centrifugal classification in a state where the silica particle raw material is dispersed in a gas, or a precipitation classification step of performing separation based on a difference in precipitation speed after dispersing the silica particle raw material in a dispersion medium.

8. The method for producing the filler for electronic material according to claim 7, comprising
a drying step after the classification step.

9. The filler for electronic material according to claim 2, wherein
the electronic material is a high frequency substrate.

10. The filler for electronic material according to claim 2, wherein
(the BET specific surface area)/(theoretical specific surface area calculated from D50) is 0.85 or greater and 1.2 or less.

* * * * *